United States Patent [19]

Fries et al.

[11] Patent Number: 5,270,673
[45] Date of Patent: Dec. 14, 1993

[54] SURFACE MOUNT MICROCIRCUIT HYBRID

[75] Inventors: Keith L. Fries, Spokane; Mark H. Bitz, Liberty Lake, both of Wash.

[73] Assignee: Hewlett-Packard Company, Palo Alto, Calif.

[21] Appl. No.: 919,478

[22] Filed: Jul. 24, 1992

[51] Int. Cl.$^5$ .......................................... H01P 5/00
[52] U.S. Cl. ................................ 333/246; 333/247; 29/846
[58] Field of Search .................... 333/33, 246, 247; 29/846; 228/180.2

[56] References Cited

U.S. PATENT DOCUMENTS

| | | |
|---|---|---|
| 3,351,816 | 11/1967 | Sear et al. |
| 3,398,232 | 8/1968 | Hoffman |
| 3,460,069 | 8/1968 | Uberbacher et al. |
| 3,568,098 | 3/1971 | Gerst |
| 3,780,431 | 12/1973 | Feeney ............................ 29/626 |
| 3,876,822 | 4/1975 | Davy et al. |
| 4,127,832 | 11/1978 | Riblet |
| 4,150,345 | 4/1979 | Goldman et al. .................. 333/116 |
| 4,366,198 | 12/1982 | Ramspacher, Jr. ................ 428/43 |
| 4,372,046 | 2/1983 | Suzuki ............................ 29/852 |
| 4,375,053 | 2/1983 | Viola et al. ..................... 333/116 |
| 4,375,054 | 2/1983 | Pavio ............................. 333/116 |
| 4,538,346 | 9/1985 | Street ........................... 29/602 R |
| 4,600,907 | 7/1986 | Grellman et al. ................. 333/246 |
| 4,609,892 | 9/1986 | Higgins, Jr. ..................... 333/204 |
| 4,626,805 | 12/1986 | Jones ............................. 333/33 |
| 4,647,878 | 3/1987 | Landis et al. .................... 333/115 |
| 4,673,904 | 6/1987 | Landis ........................... 333/238 |
| 4,681,656 | 7/1987 | Byrum ............................ 156/645 |
| 4,758,927 | 7/1988 | Berg ............................. 361/401 |
| 4,806,892 | 2/1989 | Thorpe et al. .................... 333/246 |
| 4,821,007 | 4/1989 | Fields et al. .................... 333/238 |
| 4,891,686 | 1/1990 | Krausse, III ................... 333/246 X |
| 5,023,624 | 6/1991 | Heckaman et al. .............. 333/247 X |

FOREIGN PATENT DOCUMENTS 156702 6/1990 Japan ............................ 333/247

OTHER PUBLICATIONS

Ellenberger, "Packaging Faster Silicon Circuits," *High Speed Outlook*, pp. 121–124, Aug., 1988.
ASPE RF Surface Mount Advance, Total Glass-Filled Cavities Maintain 50 Ohm Lines Integrity, Brochure by ASPE, Inc, Towaco, N.J., one page, not dated.
MA4GM201 Series GaAs MMIC DC-2 GHz SPST Switch, Brochure by M/A-COM Advanced Semiconductor Operations, Lowell, Mass., 3 pages, not dated.
Ishitsuka et al., "Low Cost, High Performance Package For A Multi-Chip MMIC Module," NTT Applied Electronics Laboratories, 1988 IEEE, pp. 221–224.
Pengelly et al., "High Performance 20-GHz Package for GaAs MMICs," *MSN & Communications Technology*, 1988, 5 pages.
Brochure describing Tektronix TEKPAK, undated, 2 pages.

*Primary Examiner*—Paul Gensler

[57] ABSTRACT

A surface-mountable packageless hybrid comprising a ceramic substrate with circuit elements attached to a top surface of the substrate is soldered to a ground pad on a printed circuit board. A high performance transition for microwave frequency signals between the circuit board and the substrate is provided by RF connections comprising three gull wing shaped leads connecting three solder pads on the printed circuit board to three solder pads on the substrate, the solder pads having capacitive matching sections to compensate for lead inductance. The center lead conducts the microwave frequency signal while the outer leads are grounded.

14 Claims, 3 Drawing Sheets

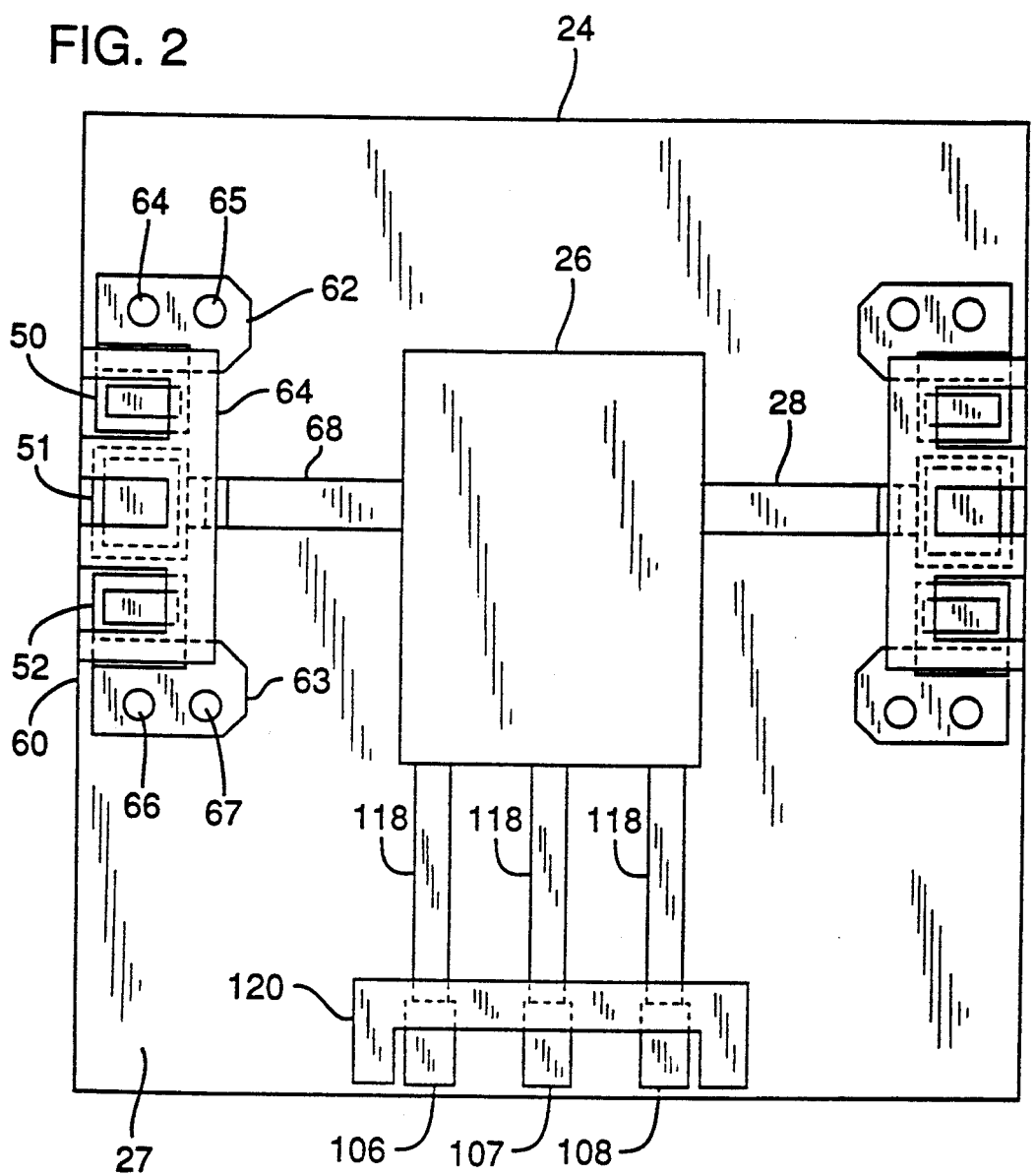

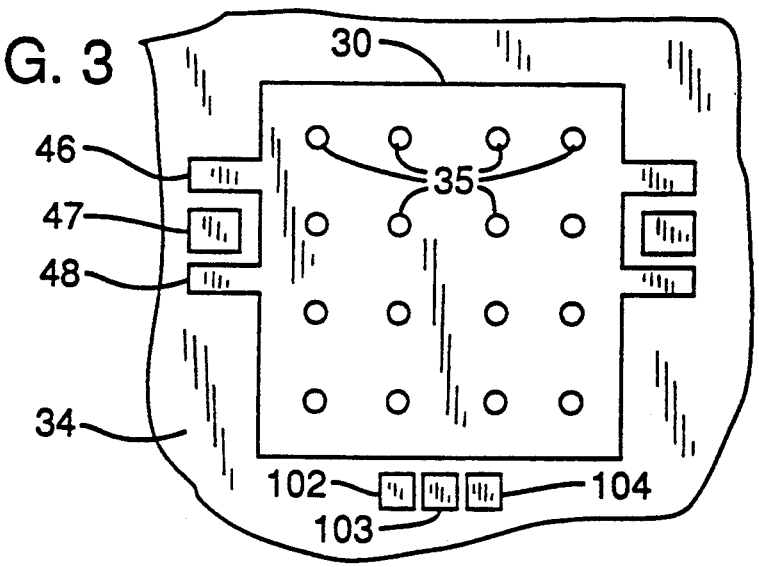
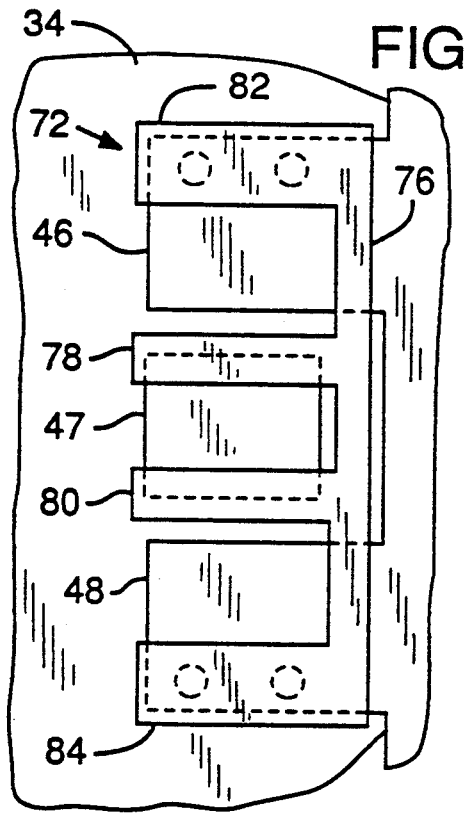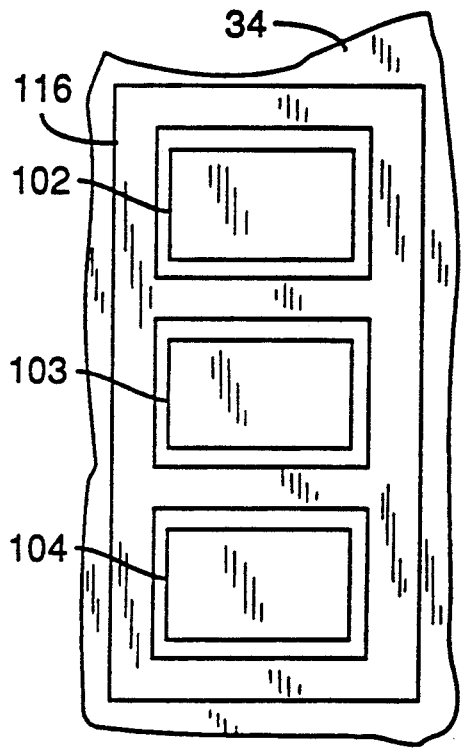
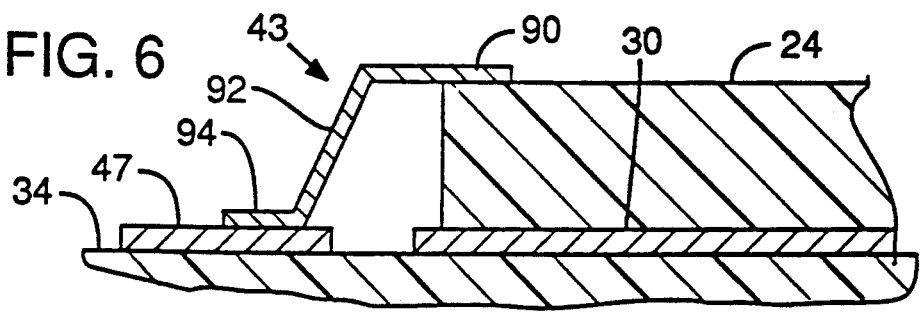

SURFACE MOUNT MICROCIRCUIT HYBRID

FIELD OF THE INVENTION

The present invention relates to mounting of microwave frequency hybrid circuits on a printed circuit board, and more particularly to a modular, surface-mountable, packageless hybrid.

BACKGROUND AND SUMMARY OF THE INVENTION

It is often necessary to employ hybrid circuits to obtain desirable circuit performance at microwave frequencies. However, it is usually difficult and expensive to integrate hybrid circuits into a printed circuit board design. Another disadvantage of most designs which integrate hybrid circuits with printed circuit boards is that the hybrid circuit requires a lot of area on the printed circuit board.

A traditional approach to integrating hybrids and printed circuit boards is to package the hybrid circuit in a machined metal package. The metal packaged hybrid includes coaxial radio frequency (RF) connections as an interface to the printed circuit board. Both the metal package and the coaxial connections of this design approach are typically bulky and expensive.

Another approach that has been used is to package the hybrid in a multi-layer co-fired ceramic package. This approach is typically used to package an integrated circuit (IC) chip and a few other circuit components. These ceramic packages are offered in standard layout configurations which limits the design circuit elements and, hence, the design flexibility. This approach also tends to be expensive.

Yet another approach is to employ edge clips to connect a hybrid circuit to a printed circuit board. The disadvantage to this interface is that the electrical performance is poor, providing adequate operation up to only 1 or 2 GHz.

In accordance with the present invention, a surface-mount packageless hybrid (SMPH) is provided for direct attachment to a printed circuit board without additional carriers or packages. The SMPH includes an alumina thickfilm substrate. Circuit elements are attached or formed on the substrate using conventional processes and interconnected with microstrip. The entire back surface of the substrate is attached to a ground pad on the printed circuit board with solder or with conductive epoxy. Connections between the printed circuit board and the substrate are done in sets of three gull-wing shaped leads which connect three pads on the printed circuit board to three pads on the substrate. The pads provide capacitive matching sections to compensate for lead inductance. For an RF connection, the central lead of the three is a signal lead, and the outer two leads are ground leads. The same lead pattern is used for DC connections with each of the three leads capable of carrying a separate DC signal. The circuit elements on the substrate are protected with a cover or by encapsulation. However, the substrate is not enclosed in a package.

The SMPH provides an efficient method of integrating a hybrid circuit and a printed circuit board with minimal printed circuit board area requirements while maintaining a high performance RF transition and placing minimal restrictions on hybrid circuit design. With a packageless design, the SMPH is made less bulky and consumes less area on the printed circuit board. The SMPH provides transition compensation by means of the lead and pad design and by soldering or conductive epoxying the back of the substrate to the ground pad on the printed circuit board. Gross leak hermeticity is also provided. The surface mount packageless hybrid design is capable of high performance transitions in the lower microwave frequency region up to around 4 GHz. Higher frequency operation is also possible with less compensation.

SMPH hybrids have the further advantage of using standard hybrid circuit elements and assembly processes. SMPH hybrids are also compatible with standard surface mount printed circuit assembly processes.

Additional features and advantages of the invention will be made apparent from the following description of the preferred embodiment, which proceeds with reference to the accompanying drawings.

DESCRIPTION OF THE DRAWINGS

FIG. 2 is a plan view of the substrate of the surface mount packageless hybrid of FIG. 1.

FIG. 3 is a plan view of the ground pad of the surface mount packageless hybrid of FIG. 1.

FIG. 4 is an enlarged plan view of the RF connection and solder mask of the ground pad of FIG. 3.

FIG. 5 is an enlarged plan view of the DC connection and solder mask of the ground pad of FIG. 3.

FIG. 6 is a sectional view taken on line 6—6 of FIG. 1.

DETAILED DESCRIPTION OF THE PREFERRED EMBODIMENT

Figure 1:
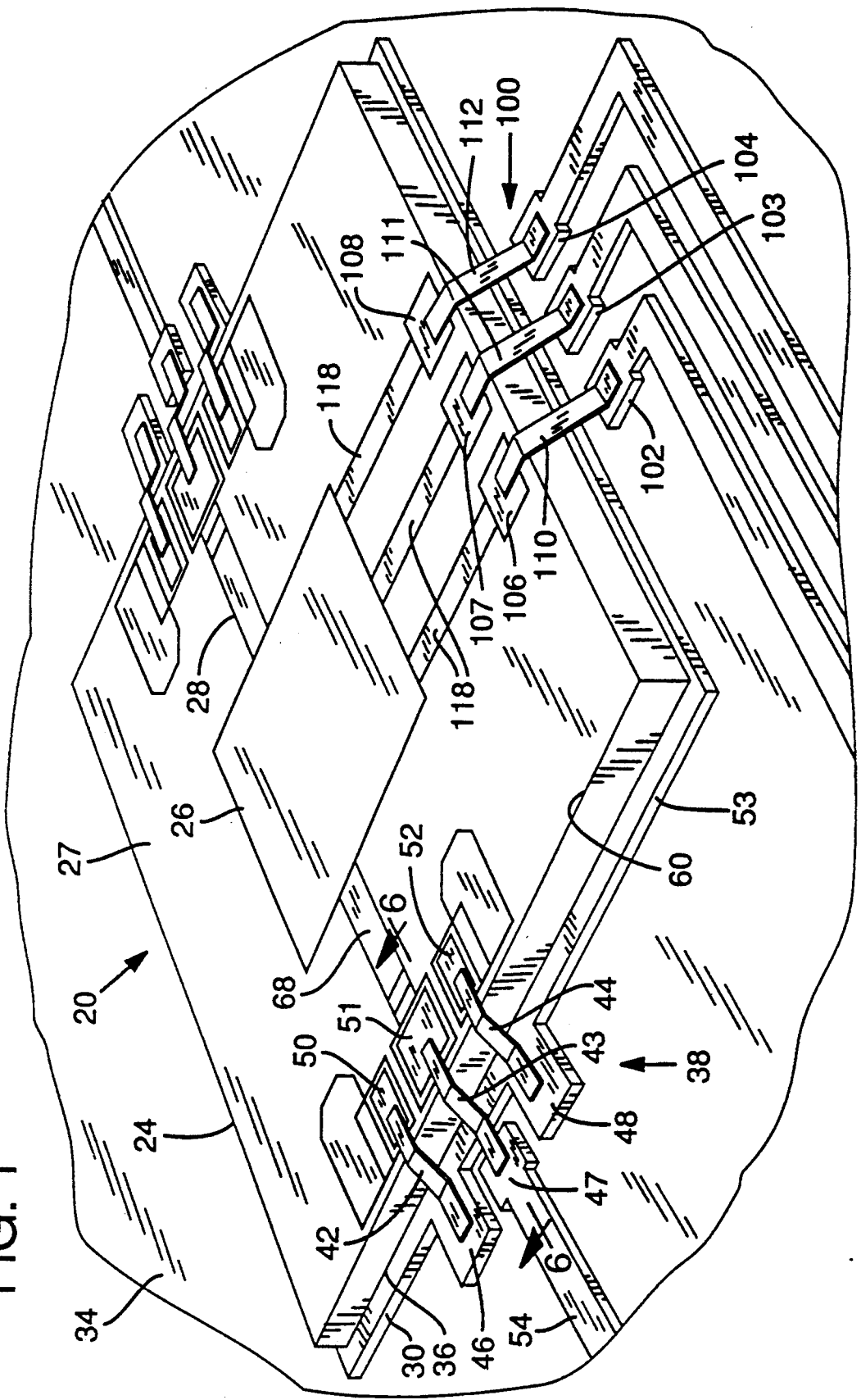
FIG. 1 is a perspective view of a mount packageless hybrid according to the present invention.

With reference to FIGS. 1 and 2, a surface mount packageless hybrid 20 according to the present invention comprises a ceramic substrate 24 which, in a preferred embodiment, has dimensions of approximately 500 mil × 500 mil × 25 mil. The ceramic substrate 24 is a conventional alumina thickfilm hybrid preferably composed of approximately 96% alumina.

For purposes of facilitating illustration of the invention, the features on the top surface of the substrate have not been shown in true three-dimensional isometric form in FIG. 1. However, the illustration is deemed sufficient to show the interconnection of elements of the invention.

The ceramic substrate 24 serves as a base for thick film and hybrid circuit elements 26. In FIGS. 1 and 2, the circuit elements are shown for purposes of illustration as simply a generalized and idealized block. Thick film circuit elements are fabricated onto the substrate using conventional thick film circuit manufacturing techniques. Typically, the thick film circuit elements are screened onto the substrate and then fired. Thick film circuit elements include, but are not limited to, the following: microstrip traces, via connections to ground, nonconductive masks, component mounting pads, printed resistors, printed capacitors, and printed inductors. Hybrid circuit elements are attached using conventional assembly process techniques. Hybrid circuit elements include, but are not limited to, transistor chips, integrated circuit chips, semiconductor chips, packaged chips, surface mount devices, and leaded components. Microstrip conductors 28, fabricated on the substrate using conventional thick film fabrication processes, connect the thick film and hybrid circuit elements 26 to lead attach areas 38 and 100 (described below). The hybrid circuit elements are protected by encapsulation or with a cover. The hybrid circuit elements may be encapsulated, for example, with epoxy encapsulation. Ceramic, plastic or metal are suitable material for a cover.

With reference to FIGS. 1-3, the ceramic substrate 24 is attached to a ground pad 30 on a printed circuit board 34. In a preferred embodiment, the ground pad 30 is approximately 520 mil×520 mil and made of copper. The printed circuit board 34 is preferably made of FR-4 printed circuit board material. However, other printed circuit board materials such as Teflon-glass or cyanate ester have also been found to be suitable for constructing the printed circuit board 34. The ground pad 30 is fabricated onto the printed circuit board 34 in the same manner as traces are fabricated onto the printed circuit board. A number of plated through holes 35 connect the ground pad 30 to a ground plane (not shown) on the back side of the printed circuit board. A bottom surface 36 of the ceramic substrate 24 is attached to the ground pad 30. The attachment can be made by using either a reflow solder process or a conductive epoxy process. The ground pad 30 provides a good ground for the substrate and assists in thermal management. The degree of thermal mismatch between the ceramic substrate and the printed circuit board material limits the maximum size of the substrate.

Signal connections between the printed circuit board 34 and the substrate 24 are of two types, radio frequency (RF) connections and direct current (DC) connections. An RF connection 38 comprises three leads 42-44 which connect three rectangular printed circuit board solder pads 46-48 on the printed circuit board 34 to three substrate solder pads 50-52 on the substrate 24.

With reference to FIGS. 1, 3 and 4, the printed circuit board solder pads 46-48 are adjacent to one edge 53 of the ground pad 30. The outer two pads 46 and 48 of the printed circuit board solder pads are rectangular protruding lobes of the ground pad 30. The outer pads 46, 48 protrude outwardly approximately 70 mil from the ground pad 30 and have a width of approximately 50 mil. The rectangular center pad 47 of the printed circuit board solder pads is spaced from the ground pad by approximately 20 mil and has dimensions of approximately 50 mil×50 mil. The printed circuit board solder pads 46-48 are separated from each other by approximately 10 mil. With reference to FIG. 1, the center pad 47 is connected to a transmission line 54 on the printed circuit board which conducts an RF signal. The outer pads 46 and 48 are connected to the ground pad 30 and are, therefore, grounded.

Referring to FIGS. 1 and 2, the substrate solder pads 50-52 are on the top surface 27 of the substrate 24 adjacent to an edge 60 of the substrate. When the substrate is attached to the ground pad 30 as shown in FIG. 1, the substrate solder pads 50-52 will be adjacent to the printed circuit board solder pads 46-48 respectively. In the preferred embodiment, each of the substrate solder pads 50-52 is approximately 50 mil×50 mil and separated by approximately 10 mil. The outer substrate solder pads 50, 52 are connected to adjoining pads 62, 63 having printed through holes 64-67. The printed through holes 64-67 provide a conducting path to the ground pad 30. A microstrip conductor 68 connects the center substrate solder pad 51 to the circuit elements 26, conducting the RF signal to the circuit elements.

The high frequency performance of the RF signal connection 38 is effected through capacitive matching to compensate for lead inductance. Shunt capacitance is provided by enlarging the center substrate solder pad 51 and by closely spacing the outer substrate solder pads 50, 52 to the center substrate solder pad 51 and the outer printed circuit board solder pads 46, 48 to the center printed circuit board solder pad 47. This added shunt capacitance acts with the lead inductance to form a low With reference to FIGS. 1 and 6, the printed circuit board solder pads 46-48 are connected to the substrate solder pads 50-52 with three gull wing shaped leads 42-44. The leads can be attached to the solder pads by brazing, by soldering with a high temperature eutectic solder such as AuSn, or with conductive epoxy. To aid in attaching the leads, a solder dam 64 (FIG. 2) and a solder mask 72 (FIG. 4) formed of a dielectric material define the solder pads. The solder dam 64 and the solder mask 72 prevent the conductive attachment material from bridging the gap between the pads.

Referring to FIG. 4, a solder mask 72 defines the printed circuit board solder pads 46-48. The solder mask comprises a base strip 76 which separates the pads 46-48 from the ground pad 30 and substrate 24; two center strips 78, 80 which separate the pads from each other; and two end strips 82, 84. The base strip 76 and the center strips 78, 80 have a width of approximately 16 mils. The distance between the center strips 78, 80 is approximately 30 mil, exposing an area of the center solder pad 47 approximately 30 mil×50 mil. Similarly, a 30 mil×50 mil area of the outer pads 46, 48 is also exposed between the center strips 48, 80 and the end strips 82, 84.

Referring to FIG. 2, a dielectric solder dam 64 defines the substrate solder pads 50-52 to prevent the conductive attachment material from bridging the gap between leads or pads. The solder dam 64 has a configuration similar to that of the solder mask 72, surrounding each pad with a dielectric material and leaving a 30 mil×40 mil area exposed on each pad for connection of the leads to the pads.

To allow for uneven expansion of the substrate, the leads 42-44 should be attached as shown in FIG. 6. A first horizontal portion 90 of the lead 43 preferably extends outwardly approximately 25 mil from the substrate before a downward sloping portion 92 of the lead. The downward sloping portion 92 extends at an angle of about 45° approximately 25 mil downward (the height of the substrate) and 25 mil horizontally to the printed circuit board solder pad 47. Although a downward angle of 45° for the downward sloping portion is preferred, angles in the range of 30° to 90° from the horizontal have been found suitable. Finally, a second horizontal portion 94 should extend for a length of at least 25 mil along the solder pad 47. The downward sloping portion 92 with the two horizontal portions 90 and 94 of the lead form a shape similar to that of a gull wing.

In the preferred embodiment, DC connections between the printed circuit board and the substrate use the same three lead pattern as the RF connections. However, any number of leads could be used in a DC connection to the substrate. With the DC connection, all three leads of the three lead pattern are available to conduct DC signals since the outer two leads are not needed for ground. Referring now to FIGS. 1, 2, 3 and 5, a DC connection 100 comprises three printed circuit board solder pads 102-104, three substrate solder pads 106-108, and three leads 110-112 connecting the printed circuit board solder pads 102-104 to the substrate solder pads 106-108. The printed circuit board solder pads 102-104 for the DC connection 100 differ from the printed circuit board solder pads 46-48 for the RF connection in that the outer pads 102, 104 are not connected to the ground pad 30. In the preferred embodiment, all three solder pads 102-104 have a surface area of approximately 30 mil×50 mil and are separated from the ground pad and each other by distances of approximately 20 mil. A solder mask 116 defines the printed circuit board solder pads 102-104 with dielectric material separating the pads.

The substrate solder pads 106-108 for the DC connection are similar to the substrate solder pads 50-52 for the RF connection in most respects. However, the outer substrate solder pads 106, 108 do not have adjoining pads 62,63 with printed through holes 64-67 as do the outer substrate solder pads 50 and 52. Instead, all three substrate solder pads 106-108 are connected to the circuit elements with microstrip conductors 118. A solder dam 120 surrounds the substrate solder pads 106-108 to prevent soldering material from moving up along the microstrip conductors 118. However, unlike the solder dam 64, the solder dam 120 does not serve to define the substrate solder pads 106-108.

The surface mount packageless hybrid 20 is preferably manufactured, in three major steps, viz. thick film fabrication, thick film hybrid assembly, and printed circuit board attachment. The first step or thick film fabrication has as its end product the ceramic substrate 24 with printed traces, pads, components, ground plane and resistors. The operations performed during thick film fabrication preferably include the following operations performed according to industry standard processes: (1) metallization involving printing, curing, and firing; (2) mask involving printing, curing, and firing; (3) fabricate resistors involving printing, curing, firing, trimming, and testing; and, (4) mask involving involving printing, curing, and firing. In the lead attach areas of the ceramic substrate, such as substrate solder pads 50-52 and 106-108, a fritted gold thick film metallization is preferred because adequate adhesion of the metallization and a suitable surface for secure lead attachment is required. The fritted gold thick film metallization provides excellent metallization to ceramic adhesion and a surface suitable for gold alloy solder, braze or weld joining processes.

The second step, hybrid circuit assembly, has as its end product a tested hybrid circuit populated with the following: surface mount, leaded and chip components; wire bonds; encapsulation or cover; and leads to connect the hybrid to the printed circuit board. Hybrid circuit assembly preferably includes the following operations performed according to industry standard processes: (1) attach leads using furnace brazing with a high temperature gold alloy material, (2) attach and connect components using solder or epoxy for attachment or connection of components and wire bond to connect chip components and tuneable circuitry; (3) electrical and mechanical testing of hybrid using manual or automated test equipment; (4) encapsulate or cover using epoxy encapsulation or epoxy attached ceramic, plastic or metal cover; and (5) form leads using a conventional die forming processes.

The third step, printed circuit board attachment, has for an end product, a tested, populated printed circuit board including a surface mount, packageless hybrid. Printed circuit board attachment preferably includes the following operations utilizing industry standard processes: (1) solder application such as by printing or dispensing solder paste on the printed circuit board; (2) placing the hybrid circuit on the printed circuit board using manual, semi-automated or automatic placement; (3) solder reflow; and (4) testing the complete printed circuit board assembly with electrical and mechanical test procedures.

Having described and illustrated the principles of our invention with reference to an illustrative embodiment, it will be recognized that the invention can be modified in arrangement and detail without departing from such principles. Although illustrated with reference to RF connectors 38 having two grounded leads 42 and 44 and associated grounded solder pads 46, 48, 50 and 52, the invention may be practiced in a variety of other forms, including using just a single signal lead 43.

In view of the many possible embodiments to which the principles of our invention may be put, it should be recognized that the embodiment described herein is illustrative only and should not be taken as limiting the scope of our invention. Rather, we claim as our invention all such embodiments as may come within the scope and spirit of the following claims and equivalents thereto.

We claim:

1. A surface-mountable microwave frequency hybrid comprising:
   a printed circuit board having a transmission line thereon, the transmission line connected to a first solder pad;
   a ground pad on the printed circuit board next to the first solder pad, the ground pad having one or more grounded solder pads projecting from the ground pad next to the first solder pad;
   a packageless carrier substrate for supporting circuit elements thereon, said substrate having a bottom surface attached to the ground pad and having a second solder pad and one or more additional substrate solder pads on a top surface thereof near an edge of the top surface, the second solder pad next to and aligned with the first solder pad and said additional substrate solder pads next to and aligned with said grounded solder pads;
   a first lead connecting the first solder pad to the second solder pad on the substrate and providing a high performance transition for a microwave frequency signal conducted on the transmission line; and,
   one or more additional leads connecting said grounded solder pads on the printed circuit board to said additional substrate solder pads.

2. The hybrid of claim 1 wherein the first lead and said one or more leads each have a gull wing shape.

3. The hybrid of claim 1 comprising capacitive matching sections on both the substrate and the printed circuit board to compensate for lead inductance.

4. The hybrid of claim 1 comprising a solder dam and a solder mask for defining said solder pads on the substrate and said solder pads on the printed circuit board respectively.

5. The hybrid of claim 1 wherein circuit elements supported on said substrate are protected by encapsulation.

6. The hybrid of claim 1 wherein circuit elements supported on said substrate are protected by a cover.

7. The hybrid of claim 1 wherein a transition between the printed circuit board and the substrate for a microwave frequency signal is provided by the first lead.

8. The hybrid of claim 1 where there are two of said grounded solder pads, two of said additional substrate solder pads, and two additional leads.

9. A surface-mountable microwave frequency hybrid comprising:
   a printed circuit board having a ground pad and transmission lines thereon;
   a substrate having a bottom surface attached to the ground pad; and
   one or more RF connection between the substrate and the transmission lines on the printed circuit board for conducting microwave frequency signals, each RF connection comprising:
   (1) a first printed circuit board solder pad on the printed circuit board connected to a transmission line near an edge of the ground pad;
   (2) one or more grounded printed circuit board solder pads on the printed circuit board protruding from the group pad next to the first solder pad;
   (3) a first substrate solder pad on a top surface of the substrate, near an edge of the substrate, and aligned with the first printed circuit board solder pad;
   (4) one or more grounded substrate solder pads on the top surface of the substrate next to the first substrate solder pad near the edge of the substrate; and
   (5) a first lead connecting the first printed circuit board solder pad to the first substrate solder pad and one or more additional leads connecting said grounded printed circuit board solder pads to said grounded substrate solder pads, the inductance of said first lead compensated with capacitive matching by said grounded pads and said additional leads.

10. The hybrid of claim 9 wherein the spacing of said grounded printed circuit board solder pads to the first printed circuit board solder pad and the spacing of said grounded substrate solder pads to the first substrate solder pad provide shunt capacitance to compensate for lead inductance.

11. The hybrid of claim 9 wherein each RF connection comprises:

a solder dam formed on said substrate solder pads to define an area of said substrate solder pads for connection of said leads; and
a solder mask formed on said printed circuit board solder pads to define an area of said printed circuit board solder pads for connection of said leads.

12. The hybrid of claim 9 wherein there are two of said grounded printed circuit board solder pads, two of said grounded substrate solder pads, and two of said additional leads.

13. The hybrid of claim 9 comprising one or more DC connections, each DC connection comprising:
   a first three solder pads on the printed circuit board, the first three solder pads connected to transmission lines near an edge of the ground pad;
   a second three solder pads on the substrate near an edge of the top surface thereof and aligned with the first three solder pads; and
   three leads connecting the first three solder pads to the second three solder pads, wherein each of the three leads conducts a separate DC signal.

14. A method for providing high performance microwave frequency transitions between a printed circuit board and a hybrid, comprising:
   forming a first set of solder pads on a printed circuit board near an edge of a ground pad, the ground pad being located on the printed circuit board, a first solder pad of said set connected to a transmission line on the printed circuit board for conducting a high frequency signal, an additional one or more solder pads of said set connected to the ground pad for grounding said same solder pads;
   forming a second set of solder pads on a top surface of a carrier substrate near an edge of said top surface;
   attaching a bottom surface of the carrier substrate to the ground pad with said first and second sets of solder pads in alignment;
   attaching leads to said first and second sets of solder pads connecting the first solder pad of said first set to a first solder pad of said second set and said additional solder pads of said first set to an additional one or more solder pads of said second set; and
   compensating for lead inductance with capacitive matching sections of said first and second sets of solder pads.

* * * * *